United States Patent

Abuelma'atti

(10) Patent No.: US 8,604,887 B1
(45) Date of Patent: Dec. 10, 2013

(54) CURRENT-FEEDBACK OPERATIONAL AMPLIFIER-BASED SINUSOIDAL OSCILLATOR

(71) Applicant: King Fahd University Petroleum and Minerals, Dhahran (SA)

(72) Inventor: Muhammad Taher Abuelma'atti, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 13/714,294

(22) Filed: Dec. 13, 2012

(51) Int. Cl.
*H03B 5/24* (2006.01)

(52) U.S. Cl.
USPC .. 331/108 B; 331/36 C; 331/135; 331/108 C; 333/217

(58) Field of Classification Search
USPC .......... 333/217; 331/108 B, 135, 36 C, 108 C
See application file for complete search history.

(56) References Cited

U.S. PATENT DOCUMENTS

| 4,603,306 | A | 7/1986 | Kleinberg |
| 4,644,306 | A | 2/1987 | Kleinberg |
| 2002/0158698 | A1 | 10/2002 | Gumm |
| 2005/0134409 | A1 | 6/2005 | Gandhi |
| 2008/0252389 | A1 | 10/2008 | Soh |
| 2010/0264996 | A1 | 10/2010 | Chang et al. |

OTHER PUBLICATIONS

Srivastava et al, Single Capacitor Controlled Oscillators using a single CFOA, 2011 International Conference on Circuits, System and Simulation IPCSIT col. 7(2011)Lacsit Press, Singapore.*
Active and Passive Elec. Comp., 1997, vol. 19, pp. 247-251: A Minimum Componentgrounded-Capacitor CFOA-Based RC Oscillator, Muhammad Taher Abuelma'atti* and Sa'ad Muhammad Al-Shahrani.

* cited by examiner

*Primary Examiner* — Arnold Kinkead
(74) *Attorney, Agent, or Firm* — Richard C. Litman

(57) ABSTRACT

The current-feedback operational amplifier-based sinusoidal oscillator provides oscillations based on a single external resistor and a single external capacitor, which exploit the internal parasitic components of the CFOA. The external resistor and external capacitor are passive, externally connected, and grounded.

1 Claim, 2 Drawing Sheets

CURRENT-FEEDBACK OPERATIONAL AMPLIFIER-BASED SINUSOIDAL OSCILLATOR

BACKGROUND OF THE INVENTION

1. Field of the Invention

The present invention relates to operational amplifier circuits, and particularly to a current-feedback operational amplifier-based sinusoidal oscillator.

2. Description of the Related Art

In the recent past, a number of sinusoidal oscillator circuits exploiting to advantage the parasitic of a single current-feedback operational amplifier (CFOA) have been proposed. The minimum number of CFOAs used is one, and the minimum number of externally connected passive components used, so far, is two. However, the circuit reported in the prior art uses a grounded capacitor and a floating resistor, and assumes that the CFOA is modeled by a two-pole model. The first pole is the open-loop dominant pole and results from the internal compensation capacitor at a terminal of the CFOA. The second pole results from the current mirrors of the CFOA. Typically, the current mirror pole frequency is much higher than the pole frequency due to the transimpedance of the CFOA. This fact should be exploited to economize on component count.

Thus, a current-feedback operational amplifier-based sinusoidal oscillator solving the aforementioned problems is desired.

SUMMARY OF THE INVENTION

The current-feedback operational amplifier-based sinusoidal oscillator takes advantage of the feasibility of designing a CFOA-based sinusoidal oscillator using two externally connected, grounded passive components. A single external resistor and a single external capacitor are used to exploit the parasitic components of the CFOA. This would be the most skeletal CFOA-based oscillator using externally connected grounded passive components.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
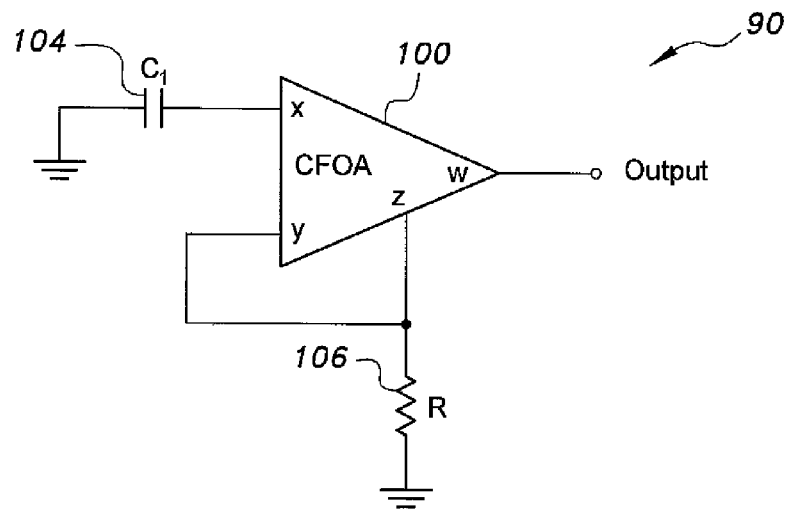
FIG. 1 is a schematic diagram of the current-feedback operational amplifier-based sinusoidal oscillator according to the present invention.
Figure 2:
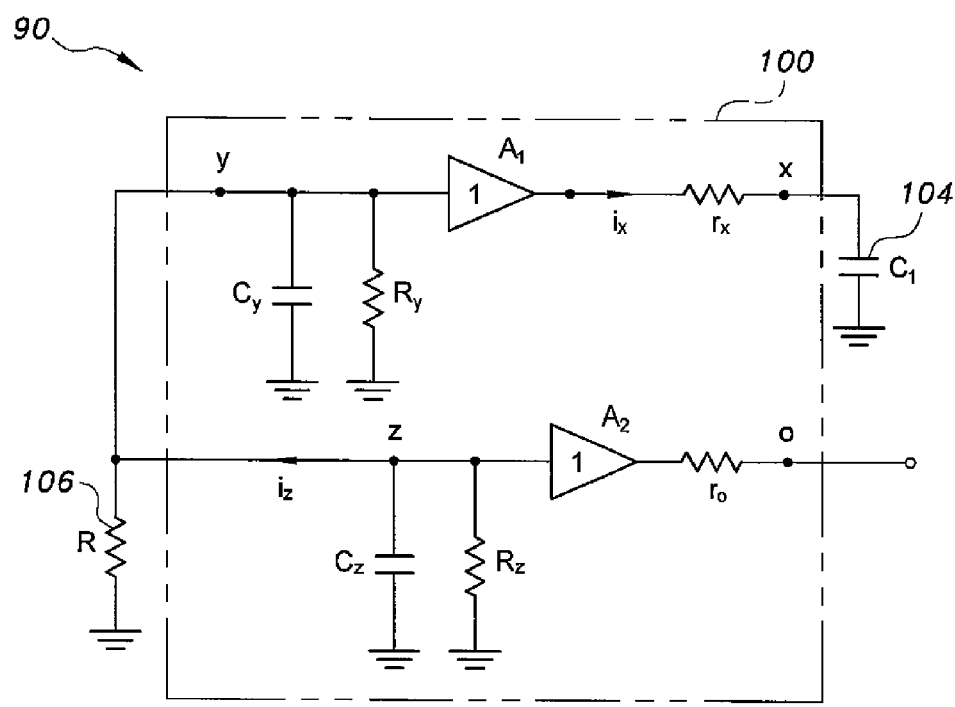
FIG. 2 is a schematic diagram of the equivalent circuit of the current-feedback operational amplifier-based sinusoidal oscillator according to the present invention.

The current-feedback operational amplifier (CFOA)-based sinusoidal oscillator 90, as shown in FIG. 1, includes a CFOA 100, an external capacitor 104 connected between the CFOA x input and ground, and an external resistor 106 connected between the y and z terminals of the CFOA 100 and ground. In FIG. 1, x and y are differential inputs to the CFOA 100, z is a slewing node, and w is the output pin. The equivalent circuit of this oscillator structure is shown in FIG. 2, wherein the dotted box represents a simplified equivalent circuit for the CFOA 100. In this equivalent circuit, $r_x$ and $r_o$ represent the output resistances of the unity-gain buffers $A_1$ and $A_2$, respectively; $C_z$ is the internally connected compensation capacitor; $R_z$ is the internal resistance of the gain node; and $C_y$ and $R_y$ represent the input impedance at terminal y of the CFOA. The structure of FIG. 1 can be easily obtained from prior art circuitry by adding a buffer to convert the plus-type second-generation current-conveyor (CCII+) to a CFOA, exploiting to advantage the parasitic resistance $r_x$ at terminal x and the parasitic capacitances $C_y$ and $C_z$ at terminals y and z, and taking the output voltage from terminal w of the CFOA.

In FIG. 2 assuming that $i_x=i_z$, $i_y=0$, $v_x=v_y$ and $v_z=v_w$, the input impedance seen at terminal x of the CFOA can be expressed as:

$$Z_{input} = -Z_2 \qquad (1)$$

where $$-Z_2 = \frac{R_2}{1+sC_2R_2}. \qquad (2)$$

In equation (2), $R_2=R_y//R_y//R$ and $C_2=C_y+C_z$. The negative impedance of equation (2) will be in parallel with the positive impedance $Z_1$ given by:

$$Z_1 = R_1 + \frac{1}{sC_1}. \qquad (3)$$

In equation (3), $R_1=r_x$. Routine analysis shows that the characteristic equation of the oscillator circuit of FIG. 1 can be expressed as:

$$\lambda^2 - \left(\frac{1}{C_2R_1} - \frac{1}{C_2R_2} - \frac{1}{C_1R_1}\right)\lambda + \frac{1}{C_1C_2R_1R_2} = 0 \qquad (4)$$

Applying the Barkhausen criterion equation (4) yields the frequency and condition of oscillation, given by:

$$\omega_0^2 = \frac{1}{C_1C_2R_1R_2} \qquad (5)$$

and $$\frac{1}{C_2R_1} - \frac{1}{C_2R_2} - \frac{1}{C_1R_1} = 0. \qquad (6)$$

However, equations (5) and (6) do not provide the correct frequency of oscillation and the condition for a successful startup for the oscillator. In order to find a better approximation for the frequency of oscillation and oscillation startup condition, the roots of equation (4) must be obtained. These roots are:

$$\lambda_{1,2} = \frac{1}{2}\left(\frac{1}{C_2R_1} - \frac{1}{C_2R_2} - \frac{1}{C_1R_1}\right) \pm \qquad (7)$$

-continued $$j\sqrt{\frac{1}{C_1C_2R_1R_1} - \frac{1}{4}\left(\frac{1}{C_2R_1} - \frac{1}{C_2R_2} - \frac{1}{C_1R_1}\right)^2}.$$

To startup and maintain oscillation, these two roots must lie in the right-hand plane. This can be satisfied if:

$$\frac{1}{C_2R_1} - \frac{1}{C_2R_2} - \frac{1}{C_1R_1} = \varepsilon_1 > 0 \quad (8)$$

and $$\frac{1}{C_1C_2R_1R_2} = \omega_0^2 > \frac{1}{4}\left(\frac{1}{C_2R_1} - \frac{1}{C_2R_2} - \frac{1}{C_1R_1}\right)^2. \quad (9)$$

The frequency of oscillation is then:

$$\omega^2 = \frac{1}{C_1C_2R_1R_2} - \frac{1}{4}\left(\frac{1}{C_2R_1} - \frac{1}{C_2R_2} - \frac{1}{C_1R_1}\right)^2 = \omega_0^2 - \varepsilon_1^2 \quad (10)$$

Inspection of equations (8) and (10) clearly shows that the frequency of oscillation can never be $\omega_0$, given by equation (5), as the condition of oscillation startup requires $\varepsilon_1 > 0$. Moreover, inspection of equations (8) and (10) shows that while the frequency and the condition of oscillation can be controlled by adjusting the externally connected grounded capacitor and/or the externally connected grounded resistor, the circuit does not enjoy independent control of the frequency and the condition of oscillation. Furthermore, equation (10) clearly shows that $\omega_0$ must be larger than $\varepsilon_1$ in order to get oscillation. Thus, with the values of $R_1$ imposed by the parasitic resistance at terminal x and $C_2$ imposed by the parasitic capacitances at terminals y and z, it is possible to calculate the value of the resistance $R_2$ required to obtain a specific frequency of oscillation for a selected value of the capacitor $C_1$. For example, with $R_1 = 50\Omega$, $C_1 = 200$ pF, and $C_2 = 6.5$ pF, the value of the resistance $R_2$ that can satisfy equation (8) must meet the condition:

$$R_2 > 51.7\Omega, \quad (11)$$

and the value of $R_2$ that can satisfy equation (10) must meet the condition:

$$36.0\Omega < R_2 < 74.0\Omega. \quad (12)$$

Thus, combining the conditions of equations (11) and (12), the resistance $R_2$ must meet the condition:

$$51.7\Omega < R_2 < 74.0\Omega. \quad (13)$$

Using this condition it is possible to select values for the resistance $R_2$ to support starting up and sustaining sinusoidal oscillations when $R_1 = 50\Omega$, $C_1 = 200$ pF and $C_2 = 6.5$ pF. In a similar way, it is always possible to find the values of the resistance $R_2$ required to support starting up and sustaining sinusoidal oscillations using the circuit of FIG. 1 for any scenario of values for $R_1$, $C_1$ and $C_2$. In practice, for a breadboard implementation, an additional capacitance of about 20 pF should be added in parallel with $C_2$ to represent the parasitic capacitance between the breadboard ground and terminals y and z.

Regarding current and voltage tracking errors, taking into account the non-idealities of the CFOA, the current- and voltage-tracking errors $i_z = \alpha i_x$, $v_y = \beta v_x$ and $v_w = \gamma v_z$, where $\alpha = 1 - \phi_1$, $|\phi_1| \ll 1$ represents the current tracking error, $\beta = 1 - \phi_2$, $|\phi_2| \ll 1$ represents the input voltage tracking error, and $\gamma = 1 - \phi_3$, $|\phi_3| \ll 1$ represents the output voltage tracking error of the CFOA, then equation (4) becomes:

$$\lambda^2 - \left(\frac{1}{C_2R_1} - \frac{1}{C_2R_2} - \frac{\alpha}{\beta C_1R_1}\right)\lambda + \frac{1}{C_1C_2R_1R_2} = 0. \quad (14)$$

Using equation (14) the oscillation startup conditions becomes:

$$\frac{1}{C_2R_1} - \frac{1}{C_2R_2} - \frac{\alpha}{\beta C_1R_1} = \varepsilon_3 > 0 \quad (15)$$

and $$\frac{1}{C_1C_2R_1R_2} = \omega_0^2 > \frac{1}{4}\left(\frac{1}{C_2R_1} - \frac{1}{C_2R_2} - \frac{\alpha}{\beta C_1R_1}\right)^2. \quad (16)$$

The frequency of oscillation is then:

$$\omega^2 = \frac{1}{C_1C_2R_1R_2} - \frac{1}{4}\left(\frac{1}{C_2R_1} - \frac{1}{C_2R_2} - \frac{\alpha}{\beta C_1R_1}\right)^2 = \omega_0^2 - \varepsilon_3^2. \quad (17)$$

Equations (15)-(17) show that the startup condition and the frequency of oscillation will be slightly affected by the input current and voltage tracking errors of the CFOA. It is obvious that the output voltage tracking error has no effect on the startup condition and the frequency of oscillation.

While the analysis leading to the condition of startup and the frequency of oscillation given by equations (15)-(17) is more accurate than the results obtainable using the Barkhausen criterion, this analysis is still approximate. In fact, sinusoidal oscillators are strongly nonlinear systems, and therefore any linear analysis for such circuits would not result in accurate predictions for the frequency and the condition for startup of the oscillation.

Figure 3:
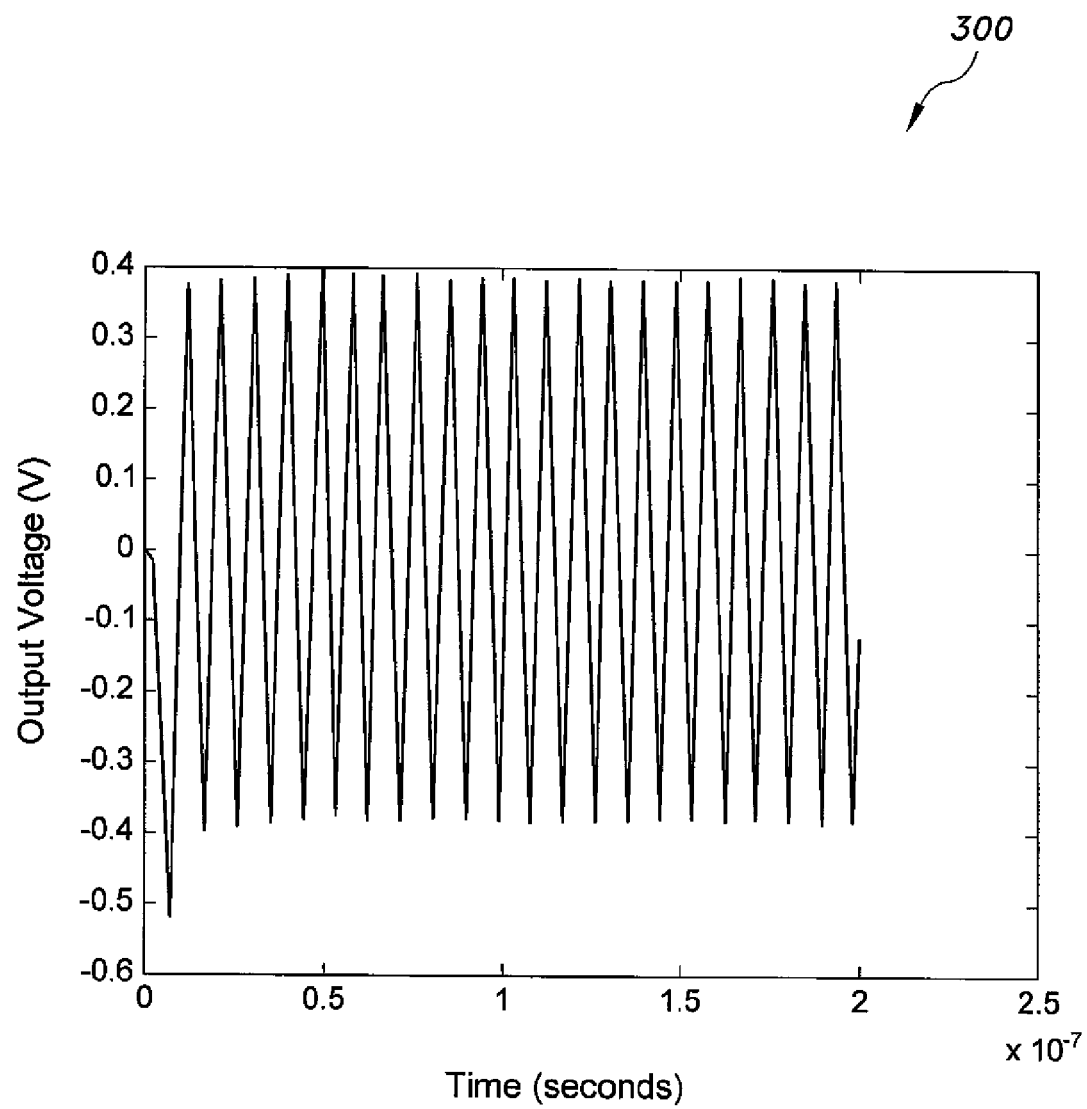
FIG. 3 is a plot of a simulation of the oscillation obtained from a current-feedback operational amplifier-based sinusoidal oscillator according to the present invention.

The simulation Results were obtained as follows. The proposed partially active-R sinusoidal oscillator circuit of FIG. 1 was simulated using the AD844 CFOA SPICE model available from Analog Devices, Incorporated using the following assumptions: $R_z \approx 3$ M$\Omega$, $C_z \approx 4.5$ pF, $R_y \approx 10$ M$\Omega$, $C_y \approx 2.0$ pF, and $r_x \approx 50\Omega$, giving $R_1 = r_x = 50\Omega$, $R_y // R_z \approx 2.3$ M$\Omega$ and $C_2 = C_y + C_z \approx 6.5$ pF. By selecting $C_1 = 200$ pF and $R = 60\Omega$, then $R_2 \approx 60\Omega$, and the condition of (13) for starting up and sustaining sinusoidal oscillation is satisfied. Sinusoidal oscillations of frequency approximately equal to 100 MHz were obtained, as shown in plot 300 of FIG. 3. The calculated value using equation (10) is approximately equal to 80 MHz. This confirms that while equation (10) yields a better approximation than the Barkhausen criterion for the frequency of oscillation, still it is not accurate. This is attributed to the strong nonlinearity of oscillator circuits and calls for the development of a new criterion for predicting the frequency and the condition of startup of oscillation, taking into consideration the strong nonlinearities of the oscillator systems.

A partial active-R sinusoidal oscillator circuit using one current-feedback operational amplifier, one externally connected grounded resistor and one externally connected grounded capacitor has been presented. The main features of the circuit are use of the minimum number of active and passive components, availability of a voltage-buffered output, exploiting to advantage the parasitic components of the CFOA, grounded element control of the frequency and condition of oscillation, and feasibility of operation at relatively high frequencies.

It is to be understood that the present invention is not limited to the embodiments described above, but encompasses any and all embodiments within the scope of the following claims.

I claim:

1. A current-feedback operational amplifier-based sinusoidal oscillator, comprising:
- an integrated circuit current-feedback operational amplifier having a first differential input, a second differential input, a slewing node, and an output;
- an external capacitor connected between ground and the first differential input; and
- an external resistor connected between ground and the second differential input and between ground and the slewing node;
- wherein the output oscillates sinusoidally at an oscillation frequency determined by the relation $$\omega^2 = \frac{1}{C_1 C_2 R_1 R_2} - \frac{1}{4}\left(\frac{1}{C_2 R_1} - \frac{1}{C_2 R_2} - \frac{\alpha}{\beta C_1 R_1}\right)^2 = \omega_0^2 - \varepsilon_3^2,$$

wherein $C_1$ is the external capacitor, $C_2 = C_y + C_z \cong 6.5$ pF, $C_y$ is an internal capacitance of the second differential input, $C_z$ is an internal capacitance of the slewing node, $\alpha/\beta$ is a current gain ratio of said CFOA, $R_1$ is an internal resistance of the first differential input, and $R_2$ is determined by a combination of the internal resistors at the second differential input, the slewing node, and the external resistor.

* * * * *